United States Patent

Toyama et al.

[11] Patent Number: 5,899,744
[45] Date of Patent: May 4, 1999

[54] METHOD OF MANUFACTURING SEMICONDUCTOR WAFERS

[75] Inventors: Kohei Toyama, Shirakawa; Shoichi Takamizawa, Takasaki; Kaneyoshi Aramaki, Nishishirakawa, all of Japan

[73] Assignee: Shin-Etsu Handotai Co., Ltd., Tokyo, Japan

[21] Appl. No.: 08/991,925

[22] Filed: Dec. 16, 1997

[30] Foreign Application Priority Data

Dec. 27, 1996 [JP] Japan .................................. 8-357982

[51] Int. Cl.$^6$ .................................................. H01L 21/302
[52] U.S. Cl. .......................................... 438/690; 438/691
[58] Field of Search ................................ 438/690, 691, 438/692, 693, 928

[56] References Cited

U.S. PATENT DOCUMENTS

| | | | |
|---|---|---|---|
| 4,276,114 | 6/1981 | Takano et al. ........................ | 438/691 |
| 5,447,890 | 9/1995 | Kato et al. ............................. | 438/691 |
| 5,494,862 | 2/1996 | Kato et al. ............................. | 438/928 |
| 5,516,706 | 5/1996 | Kusakabe .............................. | 438/691 |
| 5,747,364 | 5/1998 | Akiyama et al. ...................... | 438/691 |
| 5,800,725 | 9/1998 | Kato et al. ............................. | 438/692 |

Primary Examiner—Kevin M. Picardat
Attorney, Agent, or Firm—Loeb & Loeb LLP

[57] ABSTRACT

There is disclosed a method of manufacturing a semiconductor wafer which includes at least a slicing process for slicing a semiconductor monocrystalline ingot in order to obtain a disc-shaped semiconductor wafer. In the method, the sliced semiconductor wafer is etched before being transported to a subsequent process. Even when a monocrystalline ingot having a large diameter is sliced through use of a wire saw, the method prevents generation of breakage, cracks, chips, or the like in processes subsequent to the slicing process, thereby enabling production of large-diameter wafers with high productivity and high yield through utilization of the advantage of the wire saw in slicing a large-diameter monocrystalline ingot; i.e., high cutting speed and a small amount of slicing stock removal.

6 Claims, 3 Drawing Sheets

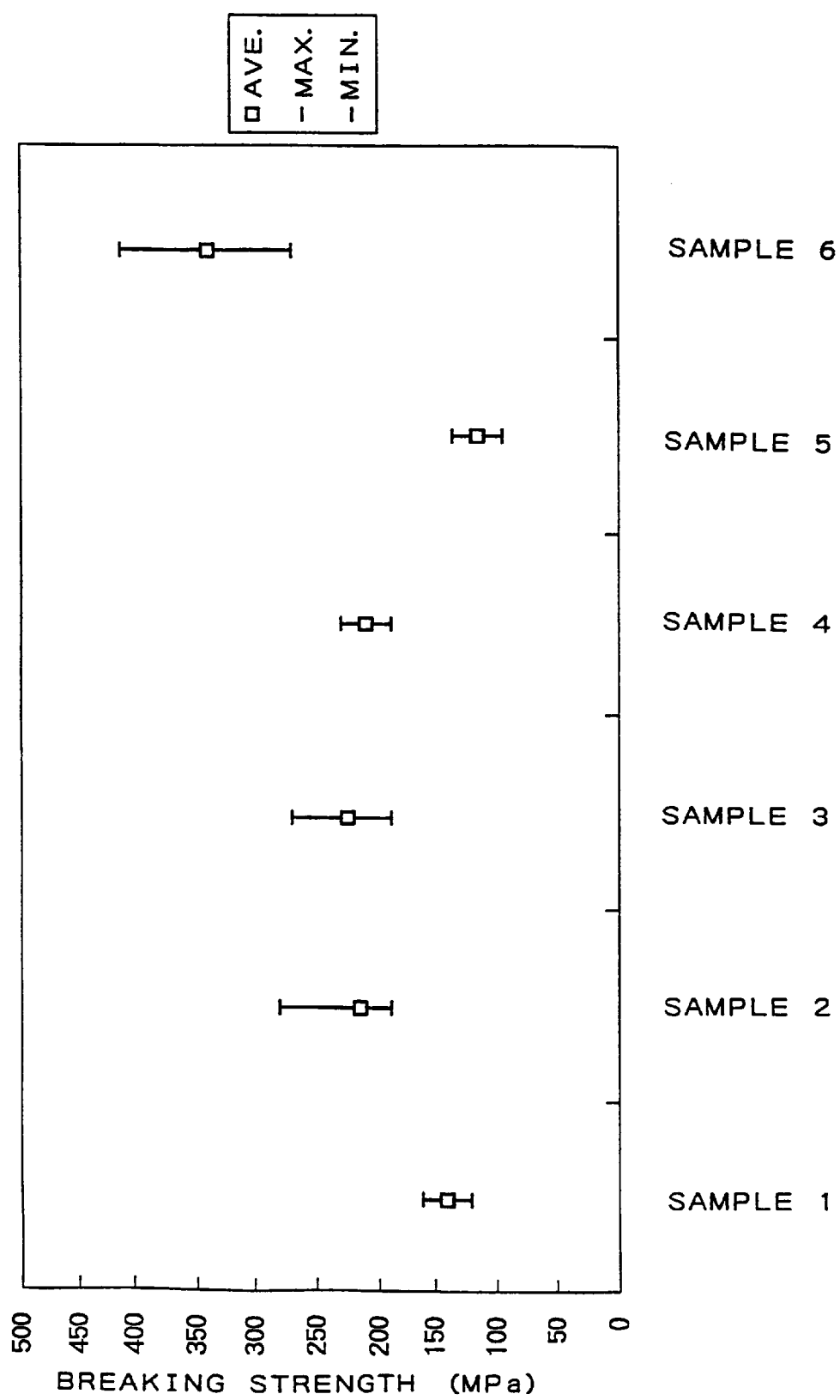

METHOD OF MANUFACTURING SEMICONDUCTOR WAFERS

BACKGROUND OF THE INVENTION

1. Field of the Invention

The present invention relates to a method of manufacturing semiconductor wafers, and more particularly to a technique used in a method of manufacturing mirror-polished wafers of semiconductor silicon, which technique can prevent generation of breakage, cracks, chips, and the like, which would otherwise be generated after a slicing process.

2. Description of the Related Art

As show in FIG. 2, a conventional method of manufacturing semiconductor wafers comprises a slicing process A for slicing into disk-shaped wafers a monocrystalline ingot manufactured by a monocrystal pulling apparatus; a chamfering process B for chamfering the outer edge of each of the wafers thus sliced in the slicing process A, in order to prevent the wafer from becoming cracked or chipped; a lapping process C for lapping the thus-chamfered wafer so as to form a flat surface thereon; an etching process D for eliminating residual mechanical damage in the surface of the chamfered and lapped wafer; a mirror-polishing process E for polishing the surface of the etched wafer; and a cleaning process F for cleaning the mirror-polished surface of the wafer so as to remove polishing agent and foreign matter adhered thereto.

In some cases, one or more of the above-described process is divided into a plurality of stages in order to improve the preciseness of wafers. Moreover, a heat treatment process, a cleaning process and the like are added to the above-described processes if needed. In some cases, the sequence of the above-described processes is modified, or some processes are omitted.

Conventionally, the slicing process A for slicing a monocrystalline ingot is performed through use of an inner-diameter slicing apparatus (hereinafter referred to as an "ID slicing apparatus"); in consideration of cutting speed (productivity), cutting efficiency (yield), cutting accuracy (quality), etc.

However, with a recent trend of increasing degree of integration and increasing precision of semiconductor devices, the diameter of wafers used as a material for semiconductor substrates has increased, so that the size of the above-described ID slicing apparatus has increased. However, since such an ID slicing apparatus is recently required to slice a monocrystalline ingot having a diameter of 8 inches, 12 inches, or more, the size of the ID slicing apparatus increases, and cutting speed cannot be increased. Especially, since the thickness of the blade must be increased from the viewpoint of strength, the slicing stock removal increases relative to the width of a wafer, resulting in a reduction in the yield of the expensive semiconductor material.

To solve the above-described drawback, a wire saw has come into more frequent use for slicing a semiconductor monocrystalline ingot. Since a wire saw can cut a monocrystalline ingot at many axial positions at one time regardless of the diameter of the ingot, the overall cutting speed is high. Further, since the wire used for cutting is thin, the slicing stock removal can be reduced in order to improve the yield.

However, when a monocrystalline ingot is sliced by such a wire saw, there arises a problem that breakage, cracks, chips, and the like are generated in wafers in processes subsequent to the slicing process, especially in the lapping process.

When a silicon monocrystalline ingot having a diameter of 8 inches is sliced through use of an ID slicing apparatus, there are generated breakage, cracks, chips, or the like in the lapping process at a frequency as low as one wafer per 1000 wafers, which is acceptable in practice. In contrast, when a wire saw is used, breakage, cracks, chips, or the like are generated at a frequency as high as one to two wafers per 100 wafers for the case of a silicon monocrystalline ingot having a diameter of 8 inches, and at a frequency as high as five to ten wafers per 100 wafers for the case of a silicon monocrystalline ingot having a diameter of 12 inches. Since the price of such a monocystalline ingot increases with diameter, the increase in the rate of generation of breakage, cracks, chips, and the like with diameter causes a huge loss.

The difference in the rate of generation of breakage, cracks, chips, and the like between the 8-inch ingot and the 12-inch ingot is considered to stem from a difference in work damage area, which difference is caused by a difference in the thickness/diameter ratio between the wafers.

SUMMARY OF THE INVENTION

The present invention has been accomplished to solve the above-mentioned problems, and an object of the invention is to provide an improved method of manufacturing semiconductor wafers, which method prevents generation of breakage, cracks, chips, or the like in processes subsequent to a slicing process, even when a monocrystalline ingot having a large diameter is sliced through use of a wire saw, thereby enabling production of large-diameter wafers with high productivity and high yield through utilization of the advantage of the wire saw in slicing a large-diameter monocrystalline ingot; i.e., high cutting speed and a small amount of slicing stock removal.

To achieve the above object, the present invention provides a method of manufacturing a semiconductor wafer which includes at least a slicing process for slicing a semiconductor monocrystalline ingot in order to obtain a disc-shaped semiconductor wafer, wherein the sliced semiconductor wafer is etched before being transported to a subsequent process.

When a sliced semiconductor wafer is etched before being transported to the subsequent process, the wafer can be transported to the subsequent process in a state in which damage of the wafer caused by the slicing process has been eliminated, so that generation of breakage, cracks, chips, or the like can be prevented.

The method of the present invention, in which a sliced semiconductor wafer is etched before being transported to a subsequent process, is preferably applied to the case where the semiconductor monocrystalline ingot is sliced through use of a wire saw, which has been common practice in recent years. This is because breakage, cracks, chips, and the like tend to be generated more frequently in a process subsequent to the slicing process if a wire saw is used in the slicing process.

The above-described method is preferably used for the case where a semiconductor silicon monocrsytalline ingot is sliced in order to obtain a semiconductor silicon wafer, as the present invention is effective in production of silicon wafers, the diameter of which has been increased to 8 inches, 12 inches, or more in order to cope with a recent increase in the degree of integration of semiconductor devices.

In such a case, a mixed acid composed of hydrofluoric acid and nitric acid is preferably used in the etching performed before the sliced semiconductor wafer is transported to the subsequent process.

Since etching through use of acid does not exhibit selectivity, a distorted layer and/or damaged layer at the surface of a wafer can be removed uniformly. In addition, since use of a mixed acid composed of hydrofluoric acid and nitric acid generates a smaller amount of heat, there does not arise a new problem that cracks are generated in a wafer due to heat shock.

In the method of manufacturing a semiconductor wafer according to the present invention, the strength of a sliced wafer can be restored by an etching process inserted after the slicing process for slicing a semiconductor monocrystalline ingot. Accordingly, the sliced wafer is prevented from suffering breakage, cracks, chips, and the like, which would otherwise occur in a process subsequent to the slicing process due to distortion induced during the slicing process.

The method of the present invention is especially effective in the case where a monocrystalline ingot having a large diameter is sliced through use of a wire saw, during which process the strength of a sliced wafer decreases considerably. This is because the strength of the sliced wafer can be recovered in order to prevent generation of breakage, cracks, chips, or the like after the slicing process. In this case, the advantage of the wire saw in slicing a large-diameter monocrystalline ingot—i.e., high cutting speed and a small amount of slicing stock removal—can be utilized, thereby enabling production of large-diameter wafers with high productivity and high yield.

In addition, since the etching performed after the slicing process reduces the thickness of a wafer to be transported to the subsequent lapping process, the amount of material to be removed by the lapping process can be reduced, thereby shortening the lapping time by 20 to 40%.

BRIEF DESCRIPTION OF THE DRAWINGS

FIG. 3 is a graph showing the measured strengths of wafers of Example 1 and Comparative Example.

DESCRIPTION OF THE INVENTION AND PREFERRED EMBODIMENTS

Figure 1:
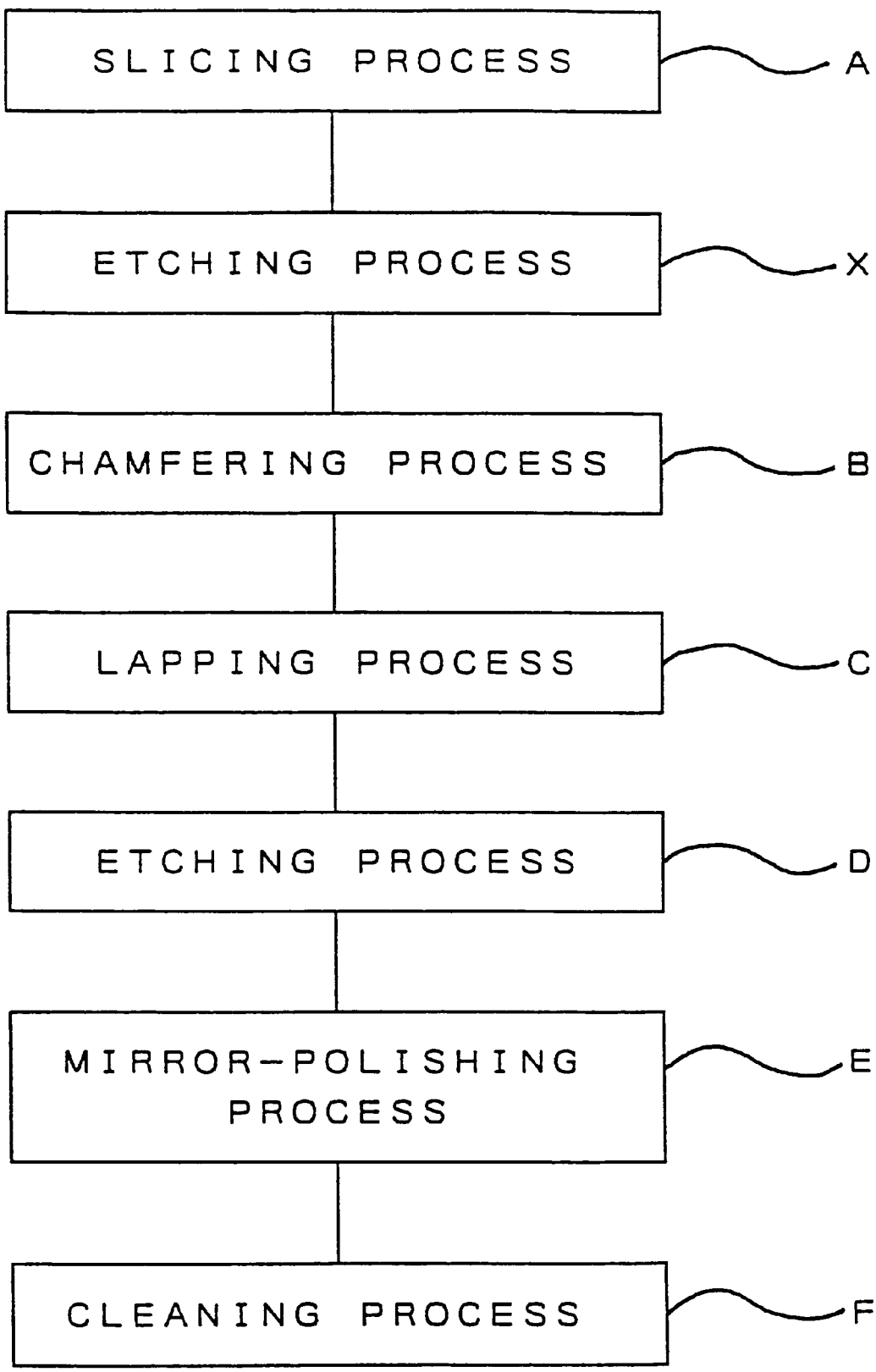
FIG. 1 is an exemplary flowchart illustrating the general processes (steps) of a method of manufacturing semiconductor wafers according to the present invention.

The present invention will be described in more detail with reference to an exemplary case in which silicon monocrystalline wafers are manufactured as semiconductor wafers.

In order to solve the problems involved in the above-described conventional method, the inventors of the present invention performed a three-point bending test in order to confirm that a wafer obtained through cutting by a wire saw actually breaks more easily than does a wafer obtained through cutting by a conventional ID slicing apparatus. The test results revealed that a wafer obtained through cutting by a wire saw has a lower strength than does a wafer obtained through cutting by an ID slicing apparatus and breaks more easily.

Although the reasons have not become clear, the inventors theorize as follows.

In general, diamonds embedded in an internal blade of a ID slicing apparatus used in a slicing process have a grain size of #325 (average grain diameter: 50–70 $\mu$m), whereas free abrasive grains used for a wire saw have a grain size of #600 (average grain diameter: 20 $\mu$m). The depth of a crack layer existing at the surface of a sliced wafer is approximately 15 to 60 $\mu$m for the former case and approximately 10 to 30 $\mu$m for the latter case.

As is understood from the above, a wafer obtained through cutting by a wire saw breaks more easily even through the depth of the surface crack layer of such a wafer is small. Therefore, breakage, cracks, chips, and the like generated in a wafer after the slicing process are considered to stem not only from the formation of the surface crack layer but also from undetectable work damage layers such as a so-called distorted layer (stress increasing layer) existing at the surface of the wafer. That is, when an ID slicing apparatus is used, the depth of the crack layer formed in a wafer is large, although the depth of the distorted layer (stress increasing layer) formed in the wafer is small. In contrast, when a wire saw is used, the depth of the distorted layer (stress increasing layer) formed in the wafer is large although the depth of the crack layer formed in a wafer is small. Therefore, in the latter case, crow tracks (or crowsfeet, defined in JIS H0613) are generated due to external pressure exerted after the slicing process, resulting in generation of breakage, cracks, chips, and the like.

The present inventors have conceived an idea of preventing generation of breakage, cracks, chips, and the like in a wafer by a method in which a damage layer (crack layer plus distorted layer) generated during the slicing process is partially or completely removed through etching in order to increase the strength of the wafer before the wafer is transported to a subsequent process such as a lapping process. The present invention has been achieved based on this idea.

Conventionally, a damage layer at the surface of a semiconductor wafer is mainly removed by the etching process D performed after the chamfering process B and the lapping process C. In contrast, in the present invention, the damage layer generated during the slicing process is partially or completely removed by an etching process inserted immediately after the slicing process A.

Accordingly, the method of manufacturing a semiconductor wafer of the present invention is performed in accordance with the process flow shown in FIG. 1. As shown in FIG. 1, an etching process X is inserted between the slicing process A and the chamfering process B of the conventional process flow.

Since the etching process X is performed in order to partially or completely remove a damage layer generated during the slicing process, the etching process X must be performed before a sliced wafer is transported to a subsequent process; i.e., must be performed immediately after the slicing process. However, the chamfering process B, the lapping process C, the mirror-polishing process E, and other processes, which are performed after the etching process X, may be modified in the above-described manner. That is, one or more of these processes may be divided into a plurality of stages in order to improve the preciseness of the process or processes, and a heat treatment process, a cleaning process or the like may be added to the above-described processes if needed. Moreover, the sequence of the processes may be modified, or some of the processes may be omitted. Accordingly, the present invention is not limited to the process flow shown in FIG. 1.

The present invention is especially useful in the case where a wire saw is used in the slicing process for slicing a semiconductor silicon monocrsytalline ingot in order to obtain a disc-shaped semiconductor silicon wafer.

Because a wafer obtained through slicing by a wire saw has a deeper distorted layer (stress increasing layer) and therefore a lower strength compared with a wafer obtained through slicing by an ID slicing apparatus, breakage, cracks, chips, and the like are more likely to be generated in a wafer obtained through slicing by a wire saw. However, the present invention can be applied to the case where a semiconductor monocrystalline ingot is sliced by an ID slicing apparatus, because breakage, cracks, chips, and the like are generated in a wafer even when the wafer is obtained through slicing by an ID slicing apparatus.

Since a wire saw has become essential in slicing a recently used large-diameter semiconductor monocrystalline ingot, the present invention can be effectively applied to the case where a large-diameter semiconductor monocrystalline ingot is sliced by a wire saw, thereby enabling a sliced wafer to be transported to a subsequent process after the strength of the wafer is recovered through partial or complete removal of a damage layer by means of etching performed before the wafer is transported to the subsequent process.

In this case, the etching conditions are determined such that a sliced semiconductor wafer is etched to a depth of several microns or more in order to partially or completely remove the damage layer of the wafer, thereby preventing generation of breakage, cracks, chips, and the like during a subsequent process stemming from damage sustained during the slicing process. Insofar as the above-requirement is satisfied, the concentration, composition, and temperature of an etchant and the time for the etching process can be freely determined so as to adjust an amount of material removed by etching.

For example, it is known that a semiconductor silicon monocrystalline wafer can be etched in acid or alkali. Alkali etching can be performed through use of KOH or NaOH at a liquid temperature of 50–85° and a concentration of 30 to 85 wt. %.

However, when alkali etching is performed for a semiconductor silicon monocrystalline wafer, selectivity occurs, thereby raising a possibility that the strength of the wafer decreases due to exposure of the crystalline plane. Therefore, it is desirable to use acid etching, which does not exhibit such selectivity.

Acid etching can be conducted through use of, for example, a mixed acid composed of hydrofluoric acid, nitric acid, and acetic acid (1:2–3:1–1.5 (volume ratio)) or a mixed acid composed of hydrofluoric acid and nitric acid (1:6–10 (volume ratio)), at a liquid temperature of 20 to 50° C. The reaction time may be determined in a wide range of 10 second to 5 minutes in accordance with the composition of the etchant.

Acid etching for silicon is generally performed through use of a mixed acid composed of hydrofluoric acid, nitric acid, and acetic acid. However, it was found that when a wafer is etched through use of such a mixed acid immediately after being sliced, there may arise a phenomenon that the wafer breaks due to heat shock. Accordingly, a mixed acid composed of hydrofluoric acid and nitric acid, which generates a smaller amount of heat, is most preferably used as the etchant in the present invention.

EXAMPLE

The present invention will be described by way of example. However, the present invention is not limited thereto.

Example 1 and Comparative Example

Measurement was performed to determine how much the strength of a wafer is actually increased by the method of the present invention.

As measurement samples, the following six samples were prepared:

Sample 1: a wafer that was sliced from an 8 inch-diameter silicon monocrystalline ingot through use of a wire saw and then cleaned.

Sample 2: a wafer that was obtained in the same manner as Sample 1 and was then etched to a depth of 10 μm from the surface through use of a mixed acid composed of hydrofluoric acid and nitric acid (1:8 in volume ratio).

Sample 3: a wafer that was obtained in the same manner as Sample 1 and was then etched to a depth of 20 μm from the surface through use of the same mixed acid as that used for Sample 2.

Sample 4: a wafer that was sliced from an 8 inch-diameter silicon monocrystalline ingot through use of an ID slicing apparatus and then cleaned.

Sample 5: a wafer that was sliced from a 12 inch-diameter silicon monocrystalline ingot through use of a wire saw and then cleaned.

Figure 2:
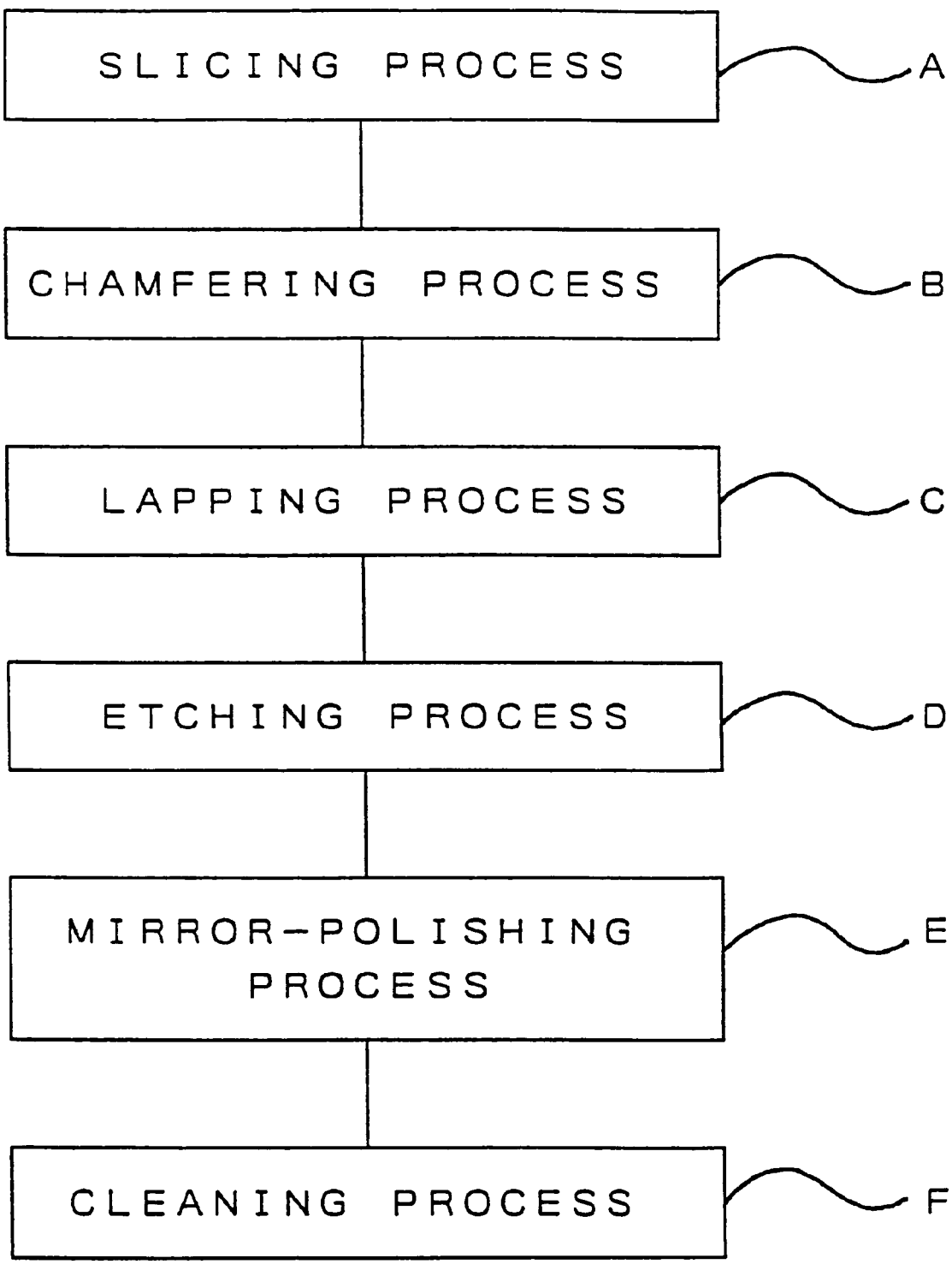
FIG. 2 is an exemplary flowchart illustrating the general processes (steps) of a conventional method of manufacturing semiconductor wafers.

Sample 6: a silicon monocrystalline mirror-polished wafer having a diameter of 8 inches that had undergone all processes of the conventional wafer manufacturing method shown in FIG. 2.

As the strength of each wafer, the breaking strength of each wafer was measured through a three-point bending test. This test was performed according to a method of testing the bending strength of fine ceramics defined in the Japanese Industrial Standard R1601-1981.

The results of the test are shown in FIG. 3.

As is apparent from FIG. 3, the wafers (Samples 1 and 5) obtained through slicing by the wire saw has a strength smaller than the wafer (Sample 4) obtained through slicing by the ID slicing apparatus. This tendency is more remarkable in the 8-inch wafers than in the 12-inch wafers.

It is understood from the test results that when the sliced wafer is lightly etched to a depth of 10 μm or 20 μm (Samples 2 and 3), the strength of the wafer is recovered.

Accordingly, when a sliced wafer is transported to a subsequent process after being etched as in the present invention, breakage, cracks, chips, and the like are hardly generated because of the recovered strength of the wafer.

Example 2

Since it was confirmed that the strength of a wafer can be improved by the method of the present invention, a running test was performed, in which 8-inch and 12-inch silicon monocrystalline wafers were actually manufactured in accordance with the process flow shown in FIG. 1. A wire saw was used in the slicing process, and the etching subsequent to the slicing process was performed through use of a mixed acid composed of hydrofluoric acid and nitric acid (1:8 in volume ratio) to etch each wafer to a depth of 10 μm.

After 10000 8-inch wafers were manufactured, and breakage, cracks, chips, and the like generated in the wafers were examined. The result of the examination showed that the ratio of generation of breakage, cracks, chips, and the like was only about 0.1%. Since the ratio of generation of breakage, cracks, chips, and the like has been 1 to 2% for the case of conventional slicing with a wire saw, the present invention realized a remarkable improvement. Similarly, 100 12-inch wafers were manufactured, and breakage, cracks, chips, and the like generated in the wafers were examined. The result of the examination showed that the ratio of generation of breakage, cracks, chips, and the like was 1%. Since the ratio of generation of breakage, cracks, chips, and the like has been 5 to 10% for the case of conventional slicing with a wire saw, the present invention realized a remarkable improvement.

The present invention is not limited to the above-described embodiment. The above-described embodiment is a mere example, and those having the substantially same structure as that described in the appended claims and providing the similar action and effects are included in the scope of the present invention.

For example, although the above-described embodiment is focused on the case where a semiconductor silicon ingot is sliced to manufacture silicon wafers, the present invention is not limited thereto and can be applied to the case where a monocrystalline ingot of compound semiconductor such as GaAs, Gap, InP or the like is sliced to manufacture semiconductor wafers.

What is claimed is:

1. A method of manufacturing a semiconductor wafer which includes at least a slicing process for slicing a semiconductor monocrystalline ingot in order to obtain a disc-shaped semiconductor wafer, wherein a wire saw is used in said slicing process in order to slice the semiconductor monocrystalline ingot to produce sliced semiconductor wafers and the sliced semiconductor wafer is etched before being transported to a subsequent process.

2. A method of manufacturing a semiconductor wafer according to claim 1, wherein a semiconductor silicon monocrystlline ingot is sliced in said slicing process in order to obtain a semiconductor silicon wafer.

3. A method of manufacturing a semiconductor wafer according to claim 2, wherein said etching is performed through use of a mixed acid composed of hydrofluoric acid and nitric acid.

4. The method of manufacturing a semiconductor wafer of claim 1 wherein the sliced semiconductor wafer has a diameter of eight inches or larger.

5. The method of manufacturing a semiconductor wafer of claim 2 wherein the sliced semiconductor wafer has a diameter of eight inches or larger.

6. The method of manufacturing a semiconductor wafer of claim 3 wherein the sliced semiconductor wafer has a diameter of eight inches or larger.

* * * * *